United States Patent
Thomas et al.

(10) Patent No.: US 7,911,368 B2
(45) Date of Patent: Mar. 22, 2011

(54) SAMPLE ERROR MINIMIZATION FOR HIGH DYNAMIC RANGE DIGITIZATION SYSTEMS

(75) Inventors: Andrew Robert Thomas, Westford, MA (US); Michael Drummy, North Reading, MA (US)

(73) Assignee: Olympus NDT, Waltham, MA (US)

( * ) Notice: Subject to any disclaimer, the term of this patent is extended or adjusted under 35 U.S.C. 154(b) by 0 days.

(21) Appl. No.: 12/605,769

(22) Filed: Oct. 26, 2009

(65) Prior Publication Data

US 2010/0103016 A1    Apr. 29, 2010

Related U.S. Application Data

(60) Provisional application No. 61/108,083, filed on Oct. 24, 2008.

(51) Int. Cl.
*H03M 1/12* (2006.01)
(52) U.S. Cl. .......................... 341/155; 341/139; 341/141
(58) Field of Classification Search .................. 341/139, 341/155
See application file for complete search history.

(56) References Cited

U.S. PATENT DOCUMENTS

| | | | | |
|---|---|---|---|---|
| 5,422,643 A * | 6/1995 | Chu et al. | ....................... | 341/141 |
| 5,714,956 A * | 2/1998 | Jahne et al. | .................... | 341/155 |
| 6,031,478 A * | 2/2000 | Oberhammer et al. | ........ | 341/155 |
| 6,317,065 B1 * | 11/2001 | Raleigh et al. | ................. | 341/139 |
| 6,333,707 B1 * | 12/2001 | Oberhammer et al. | ........ | 341/155 |
| 6,445,328 B1 * | 9/2002 | Francis | .......................... | 341/139 |

\* cited by examiner

*Primary Examiner* — Khai M Nguyen
(74) *Attorney, Agent, or Firm* — Ostrolenk Faber LLP

(57) ABSTRACT

A blending circuit is disclosed to be operable to combine plurality of digital outputs received from an analog to digital conversion system to create a composite digital signal. The analog to digital conversion system receives analog signals originated from multiple but substantially the same source signals, wherein the source signals being scaled to different degrees. A blending circuit deploys a blending factor to combine the digital outputs in a manner which blends and/or adjusts portion of each digital output being used to avoid over-flown portion of the digital outputs and to minimize phase and/or amplitude discontinuity of the composite digital signal.

20 Claims, 10 Drawing Sheets

SAMPLE ERROR MINIMIZATION FOR HIGH DYNAMIC RANGE DIGITIZATION SYSTEMS

CROSS-REFERENCE TO RELATED APPLICATIONS

The present application claims the benefit of U.S. Provisional Patent Application No. 61/108,083 filed on Oct. 24, 2008 in the name of Andrew R. THOMAS, et al., and entitled SAMPLE ERROR MINIMIZATION FOR HIGH DYNAMIC RANGE DIGITIZATION SYSTEMS, the entire contents of which are incorporated herein by reference in its entirety.

FIELD OF THE DISCLOSURE

The present disclosure generally relates to the minimization of sample errors caused by phase and amplitude errors between scaled outputs of analog to digital converter channels used in high dynamic range sensor measurement systems, and, more particularly, a method to proportionately blend, and otherwise adjust, the outputs of the converters to minimize error.

BACKGROUND OF THE DISCLOSURE

High dynamic range digitization systems provide many advantages when used in sensor measurement devices, such as ultrasonic flaw detectors, because they solve many of the problems associated with devices using analog intensive solutions. The advantages are described in detail in Thomas US 2007/0084288 A1 and summarized below.

Typically, ultrasonic flaw detectors that use high frequency sampling rate analog to digital converters in the range of 100 MSPS (million samples per second) are limited to 14 bits resulting in a maximum dynamic range of only 84 dB, an amount less than required by industry standards, and many sensor measurement applications. Background art solutions having only one analog to digital converter achieve higher dynamic range by using one or more variable gain amplifiers (VGA's), but not without significant problems.

The primary problems are: 1) the need for a large number of analog filter components and the noise, power, reliability, and size problems that go along with them; 2) the DC offset compensation required to keep the signal centered within the full scale range of the system as the gain changes is difficult to implement because it must be calibrated and applied dynamically, and 3) it is impractical to apply the advantages of digital filtering because the VGA applies a variable low pass filtering effect that must be accounted for in the digital filter, which adds much complexity to the filter system.

Accordingly, a means to meet or exceed the dynamic range of the background art system by replacing the analog variable gain function with a digital one is desirable. As taught in Thomas US 2007/0084288 A1, two or more high MSPS analog to digital converters may be used to achieve higher dynamic range to solve many of the problems associated with the analog intensive background art solutions. There is, however, a new problem created by this means that needs to be solved before optimal performance can be achieved—i.e. the problem of sample errors caused by phase and amplitude errors between adjacent scaled analog to digital converter channels.

Each embodiment of the present disclosure provides a means to solve this new problem. As will be explained in detail later in the present enclosure, the sample errors are undesirable because: 1) they degrade the signal image that is observed by the instrument operator when making inspection judgments, and 2) they add distortion to the sensor input signal, thereby increasing the likelihood of measurement errors. The Assignee of the present patent application has filed several U.S. patent applications directed to an ultrasonic fault detection system using a high dynamic range analog to digital conversion system, which published under U.S. Patent Application Publication Nos. 2007/0084288, 2009/0178485, and 2009/0223294, and the contents of said published patent applications are incorporated by reference herein.

BACKGROUND ART

Referring to FIG. 5, the background art high dynamic range digitization system requires that the input signals provided to the four analog to digital converters (503 *a* through *d*) have no substantial phase and amplitude errors after they are scaled by amplifiers 502*a*, 502*b*, 502*c* and 502*d*. If the errors are substantial, sample errors will result when the digitized outputs provided by the four analog to digital converters are assembled to provide the system's output signal. The valid ranges, in dB, for channels A, B, C and D shown in FIG. 6 are 601*a*, 601*b*, 601*c* and 601*d*, respectively.

Referring to FIG. 7, dashed line 706 represents the error between channel B's last valid sample point 705*b* and channel C's first valid sample point 702*a*. The error is most noticeable when the input signal crosses from the end of one analog to digital converter's valid range into the others because this is where the discontinuity due to skews between channels occurs.

The following description of the background art refers to specific values for ranges, dB increments, resolutions, signal points and errors; however, the background art is not limited in this regard. Indeed, different values may apply depending on the user application.

FIGS. 6 and 10 show input signal 501 of FIG. 5 in logarithmic scale to cover the full dynamic range of the background art and embodiments of the present disclosure. Axis 605 serves the dual purpose of representing: a) the signal level in dB, where 0 dB is the maximum signal amplitude of 30 volts, each fine division representing −0.5 dB, and b) the 100 MSPS analog to digital converter sample index of 10 nanoseconds (ns). Accordingly, the time at any point along axis 605 can be determined by multiplying the dB number by −10 ns—e.g. −30 db is equivalent to 300 ns.

The logarithmic representation used for FIGS. 6 through 10 was found useful when simulating and testing the design of the preferred embodiment because it allows the system's full dynamic range to be seen in one view and provides a simple means to produce a system output signal that has constant amplitude (not shown). Specifically, an increase of digital gain in dB while input signal 501 is decreasing by the same amount and rate will result in a signal with constant amplitude at the system's output. Those who are skilled in the art will appreciate that the straight line result of a constant amplitude signal makes it easier to identify sample errors as compared to using a complex waveform. Examples of this for the background art are shown by sample error magnitude plots 708 and 707 in FIG. 7 that are associated with Ch B 705 and Ch C 702, where Ch B 705 is the channel in error with respect to Ch C 702.

Referring further to FIGS. 5 and 6, the valid input signal amplitude ranges for channel A (506*a*), B (506*b*), C (506*c*) and D (506*d*) for the background art are 0 to −18 dB (601*a*), −18 to −42 dB (601*b*), −42 to −66 dB (601*c*), and −66 dB and below (601*d*), respectively. It is worth noting that although channel A has a valid input signal range of 0 to −18 dB, it will digitize the full amplitude range of input signal 501, but with less resolution than the ranges covered by channels B, C and D. Similarly, channels B, C and D will digitize input signals with amplitudes less than their respective minimum valid amplitude, but with less resolution than the adjacent channel with the prior alphabetic letter—i.e. resolution of Ch D>CH C>Ch B>Ch A.

Referring to background art FIG. 7, axis 703 serves the dual purpose of representing: a) the signal level in dB, where 0 dB is the maximum signal amplitude of 1 volt at the input to analog to digital converters Ch B 503b and Ch C 503c of FIG. 5, each fine division representing −0.5 dB, and b) the 100 MSPS analog to digital converter sample index of 10 nanoseconds (ns), meaning that the successive samples are taken in the time it takes the input signal to decrease by 0.5 dB.

Referring further to FIGS. 5 and 7:
  a) The output of analog to digital converter 503c (Ch C) is at the maximum limit of its full scale input range until the input signal amplitude decreases to −42 dB at 702a.
  b) A substantial error exists between Ch B output 504b and Ch C output 504c, which can be seen starting at sample point 702a and by error magnitude signal 708. This error may be caused by either a difference in signal amplitude or phase between Ch B 506b and Ch C 506c, or a combination of both. For the purpose of the present disclosure, the cause of the error and channel providing it make no difference. It is only the presence of a substantial error between any two adjacent channels that is important. If there were no error, point 702a of signal 702 from channel C and first sample point after 705b of signal 705 from channel B would be in the same location (not shown), as would all subsequent points not adversely affected by the quantization error of analog to digital converter 503b (not shown) explained in item c below.
  c) The signal fidelity of Ch B output 504b starts to degrade with respect to input signal 501 at point 705a because the output is below the quantization resolution of analog to digital converter 503b, thereby resulting in two equivalent successive output readings for input signal amplitudes differing by 0.5 dB, followed by a larger number of equivalent successive output readings as input signal 501 reduces further in amplitude. Accordingly, a means to select output data from the analog to digital converter operating within its full scale range having the highest resolution is a principal benefit of the high dynamic range digitization system of the present disclosure.

BRIEF DESCRIPTION OF THE DRAWINGS

FIG. 8 is used to describe the benefit of the preferred embodiment of the present disclosure.

FIG. 9 is used to describe the benefit of alternate embodiment 1 of the present disclosure.

DETAILED DESCRIPTION OF THE PREFERRED AND ALTERNATE EMBODIMENTS OF THE PRESENT DISCLOSURE

The background art and embodiments of the present disclosure pertain to a high dynamic range digitization system with four digitization channels; however, they are not limited in this regard. Indeed, fewer or more than four channels may be used to realize the benefits described in the present disclosure.

Some sections of the present disclosure describe the means by which only one set of adjacent analog to digital converter channels (i.e. Ch B (504b) and CH C (504c)) operate to reduce sample errors; however, it should be understood that the means may be applied to all adjacent analog to digital converter channels that comprise a high dynamic range digitization system.

The principal objective of the embodiments of the present disclosure is to provide a means to ameliorate the disadvantages of the background art described above. All embodiments provide a means to reduce the error magnitude caused by skewed input signals to adjacent analog to digital converter channels The following description refers to specific values for ranges, dB increments, resolutions, signal points, blend factors and errors; however, the embodiments of the present disclosure are not limited in this regard. Indeed, different values may apply as required to best suit the intended user application.

Preferred Embodiment

The preferred embodiment of the present disclosure provides a means to produce a smooth transition between adjacent channels by proportionately blending sample points to produce a new, error corrected, sample point signal at the output of the high dynamic range digitization system.

Figure 6:
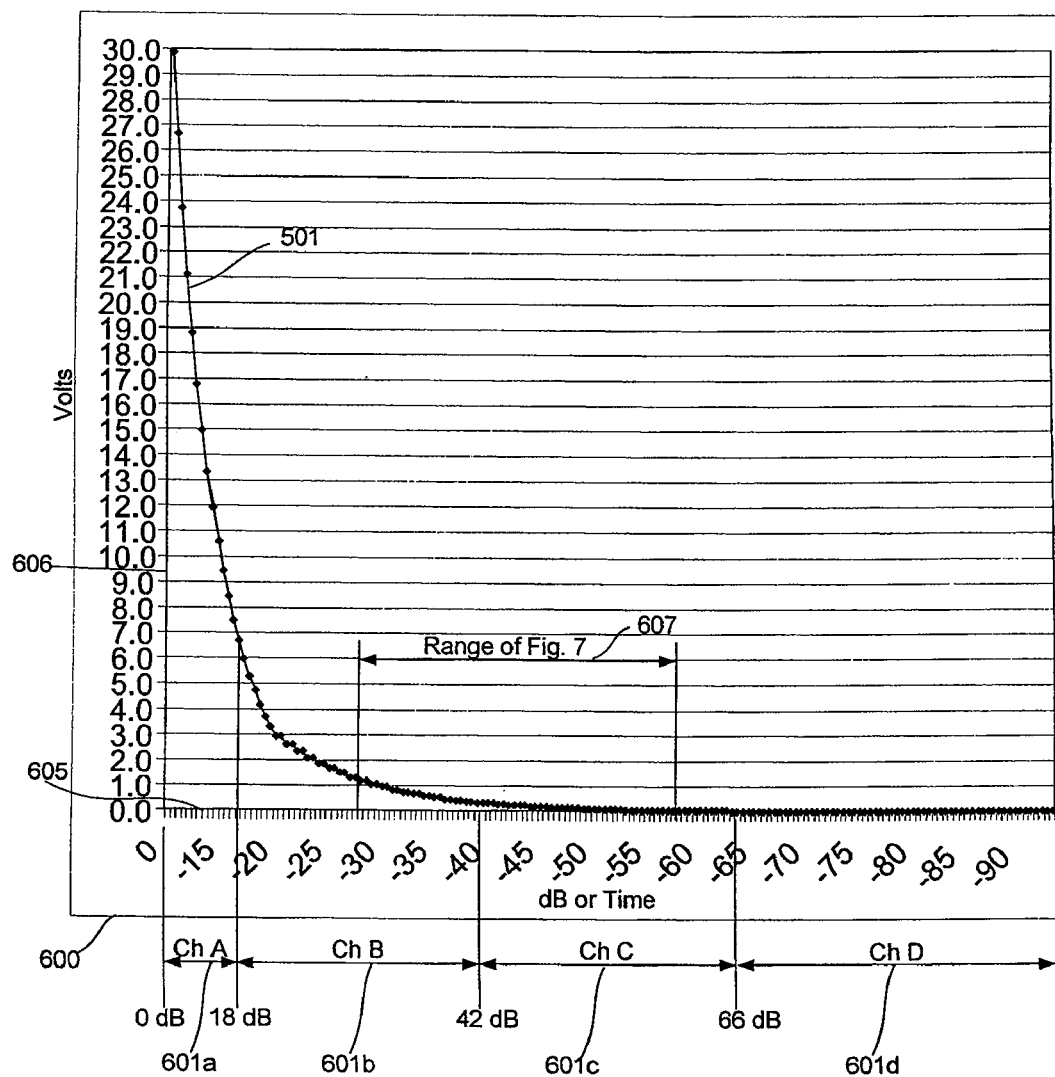
FIG. 6 shows the high dynamic range input signal with the valid signal amplitude ranges associated with the four channels of the high dynamic range digitization system of the background art.
Figure 10:
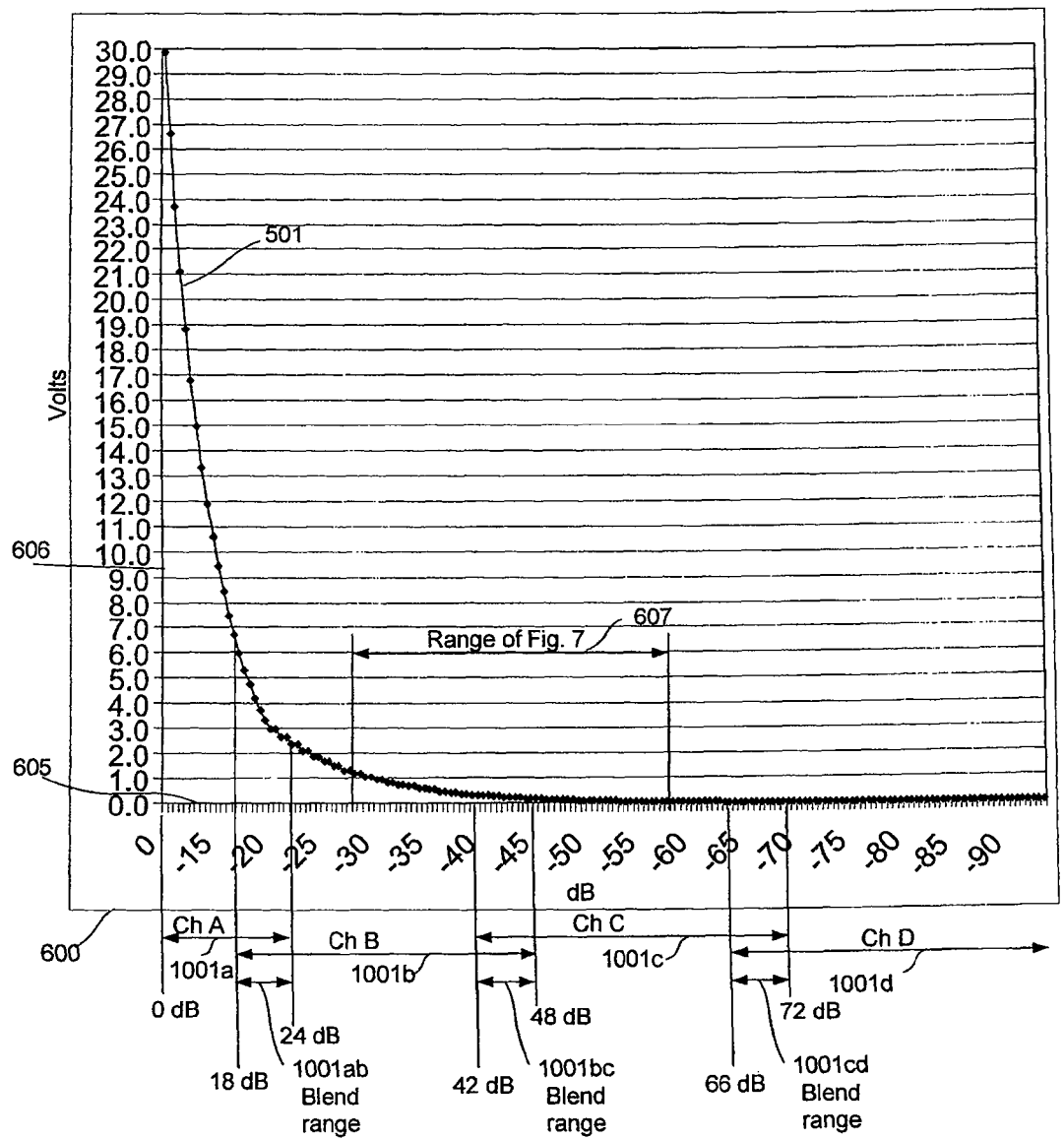
FIG. 10 shows the high dynamic range input signal with the valid signal amplitude and blend ranges associated with the four channels of the high dynamic range digitization system of the preferred embodiment of the present disclosure.

Referring to FIG. 10, and in contrast to FIG. 6, the preferred embodiment of the present disclosure apportions for each adjacent channel a 6 dB blend range that overlaps the bottom 6 dB of the valid signal range of the lower resolution channel (Ch B) with the top 6 dB valid signal range of the higher resolution channel (Ch C). The blend ranges are shown by 1001ab, 1001bc and 1001cd.

Blending ranges need not be limited to 6 dB, but can be larger or smaller depending on the blend results sought. In the case of the preferred embodiment, 6 dB was chosen for ease of design implementation because 6 dB is equivalent to the binary factor of 2:1 which lends itself to simpler logic and software functions.

Figure 1:
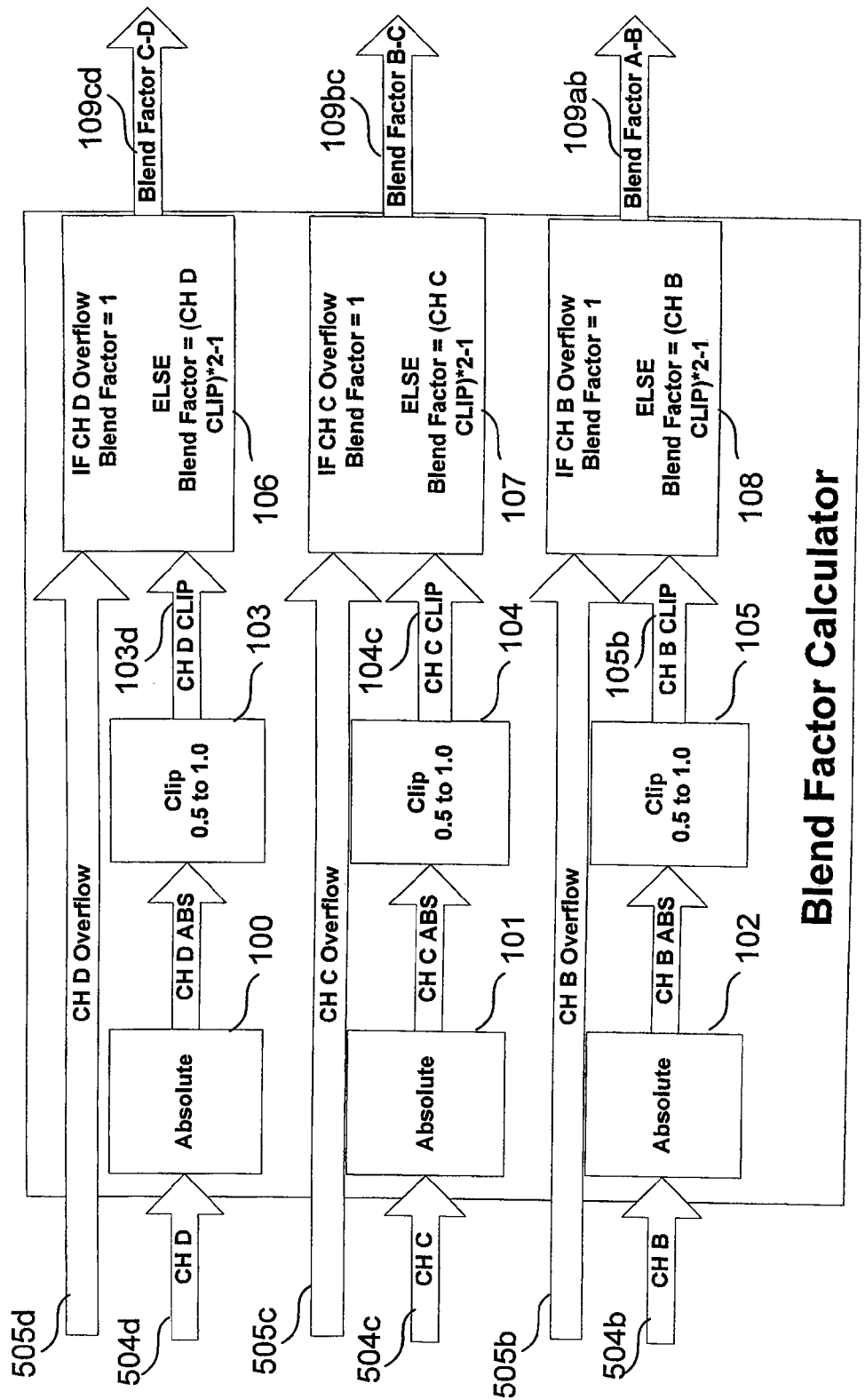
FIG. 1 shows the Blend Factor Calculator block which determines the amount of blending.
Figure 2:
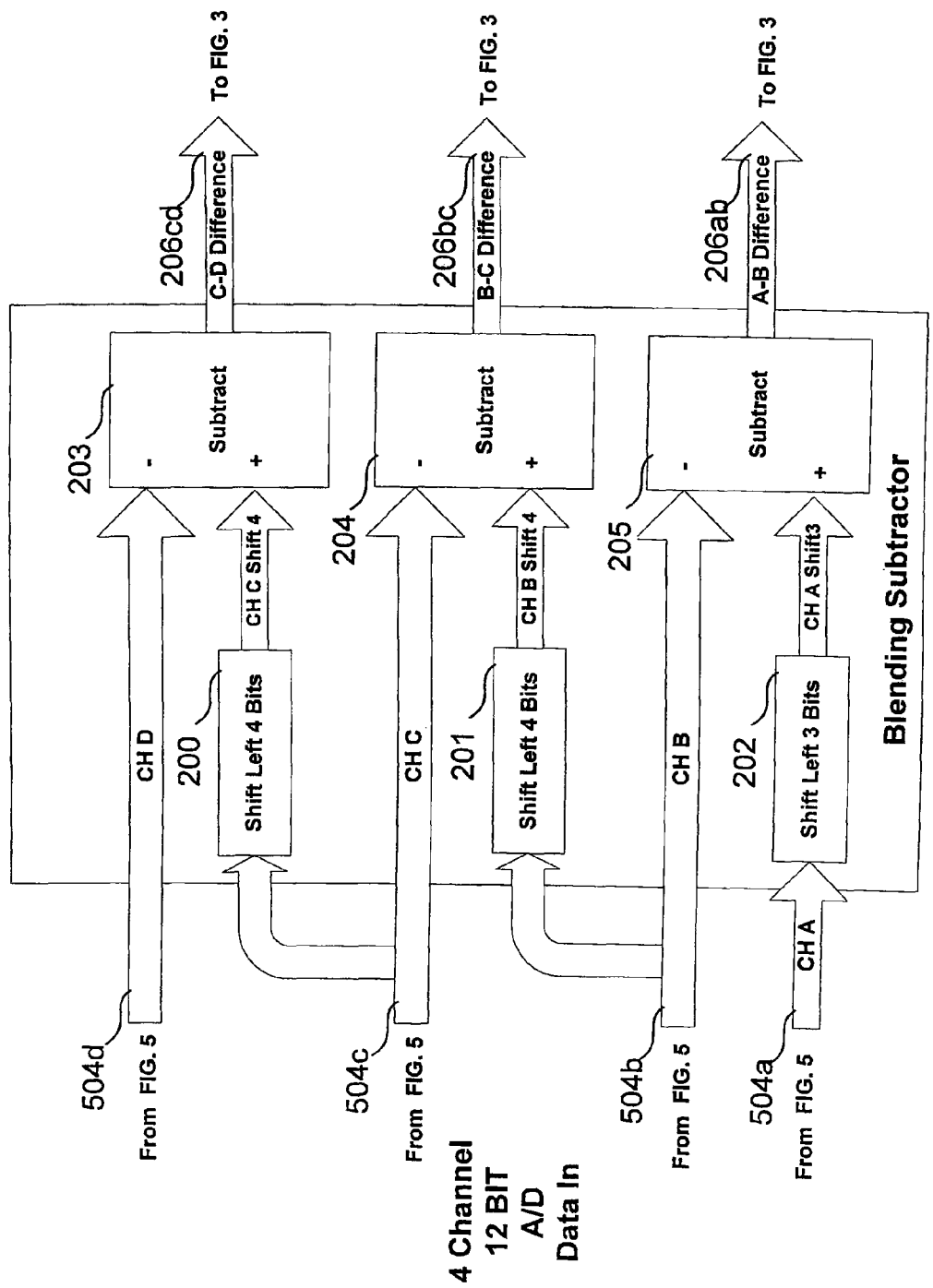
FIG. 2 shows the Blending Subtractor to determine the amplitude difference in adjacent channels.
Figure 7:
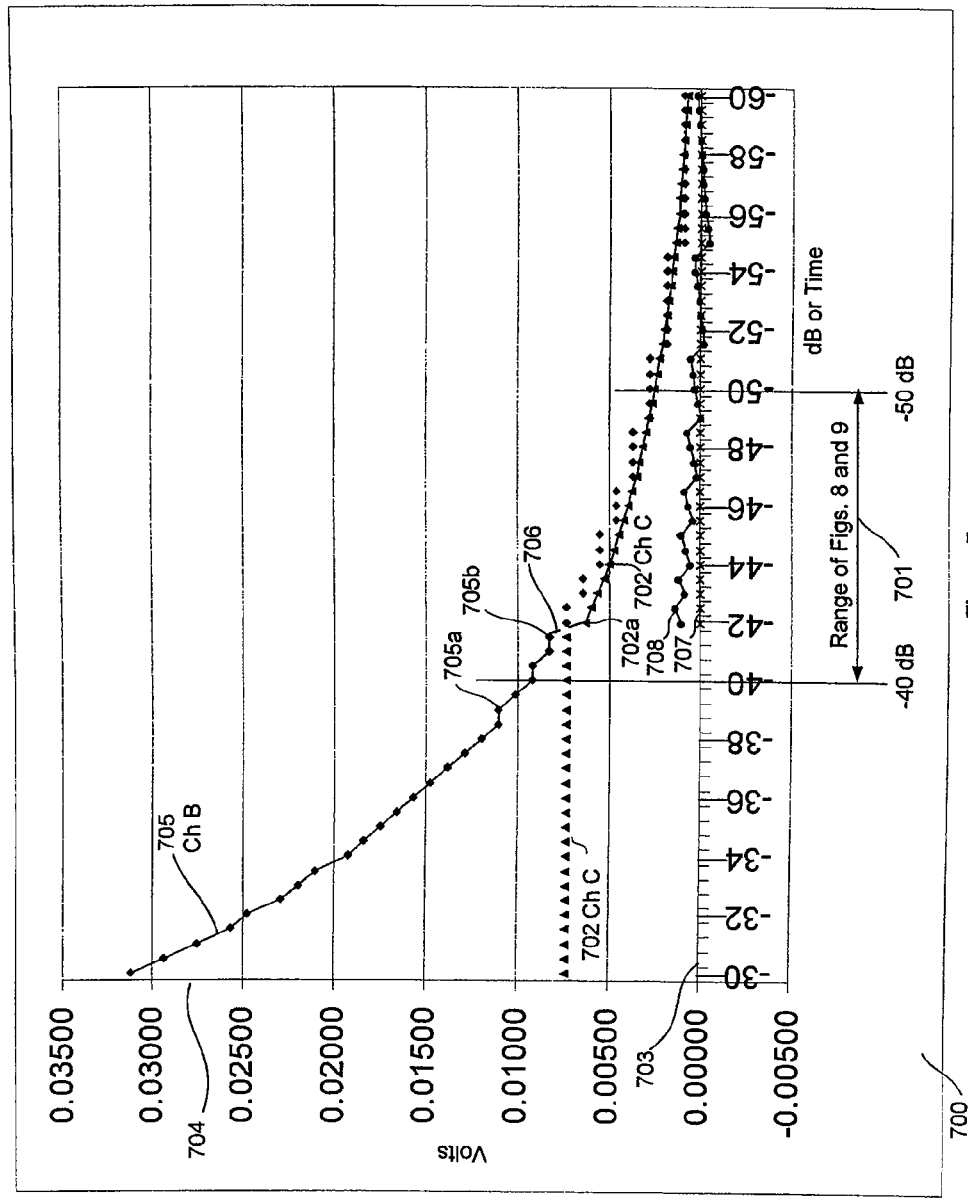
FIG. 7 shows the −30 to −60 dB range of the digitized output signals of channel B and C with errors, and is used to describe the limitations of the background art.
Figure 8:
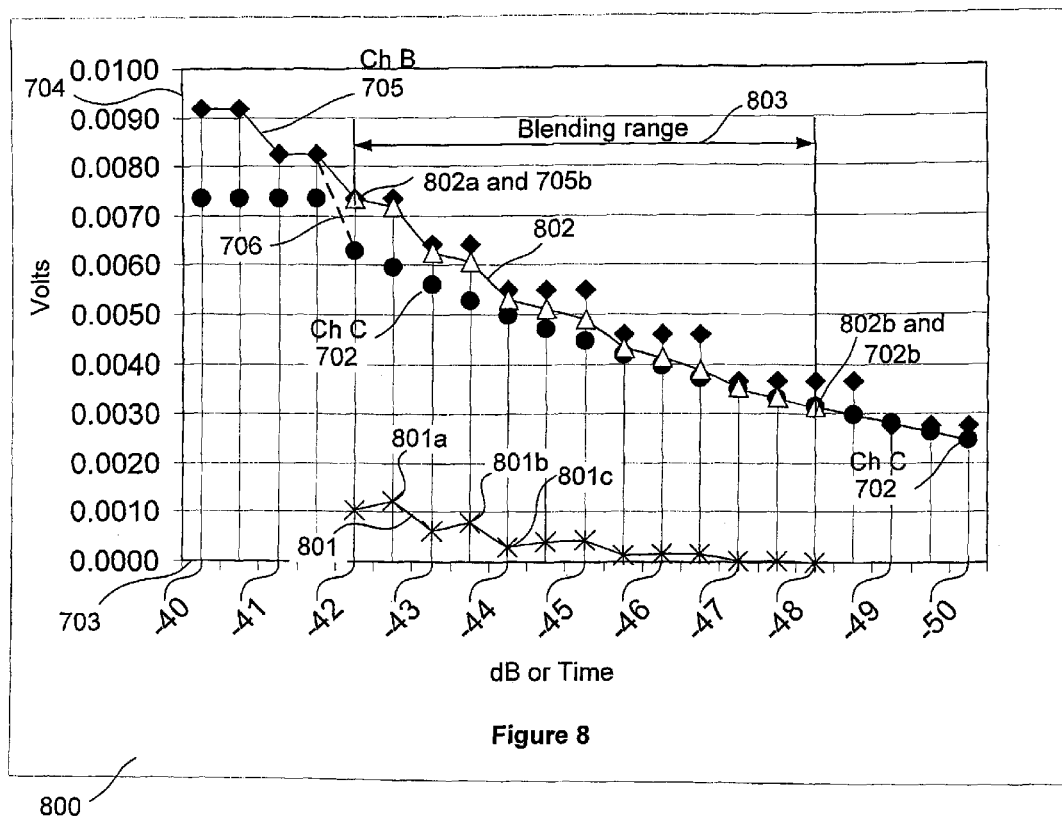
FIG. 8 shows the −40 to −50 dB range of the digitized output signals of channel B and C with errors. The blended and error signal are also shown.

Referring now to Table 1 and FIG. 8, axis 703 serves the same dual purpose as it does for FIG. 7—i.e. it represents both the signal level in dB and discrete sample locations in time. The following applies to the −40 to −50 dB output range of analog to digital converters 504b (Ch B) and 504c (Ch C):
  d) Exemplary blending range 803 for Ch B and Ch C starts at the −42 dB sample point and ends at the −48 dB sample point. The digitized value for each channel point is shown in column 3 and 5 of Table 1, respectively.

e) Exemplary blending range 803 is comprised of 13 contiguous blended points 802 separated by −0.5 dB that are calculated using Formula 1a below with the values in each row of Table 1. FIGS. 1 and 2 also apply to the following formulas.

Figure 5:
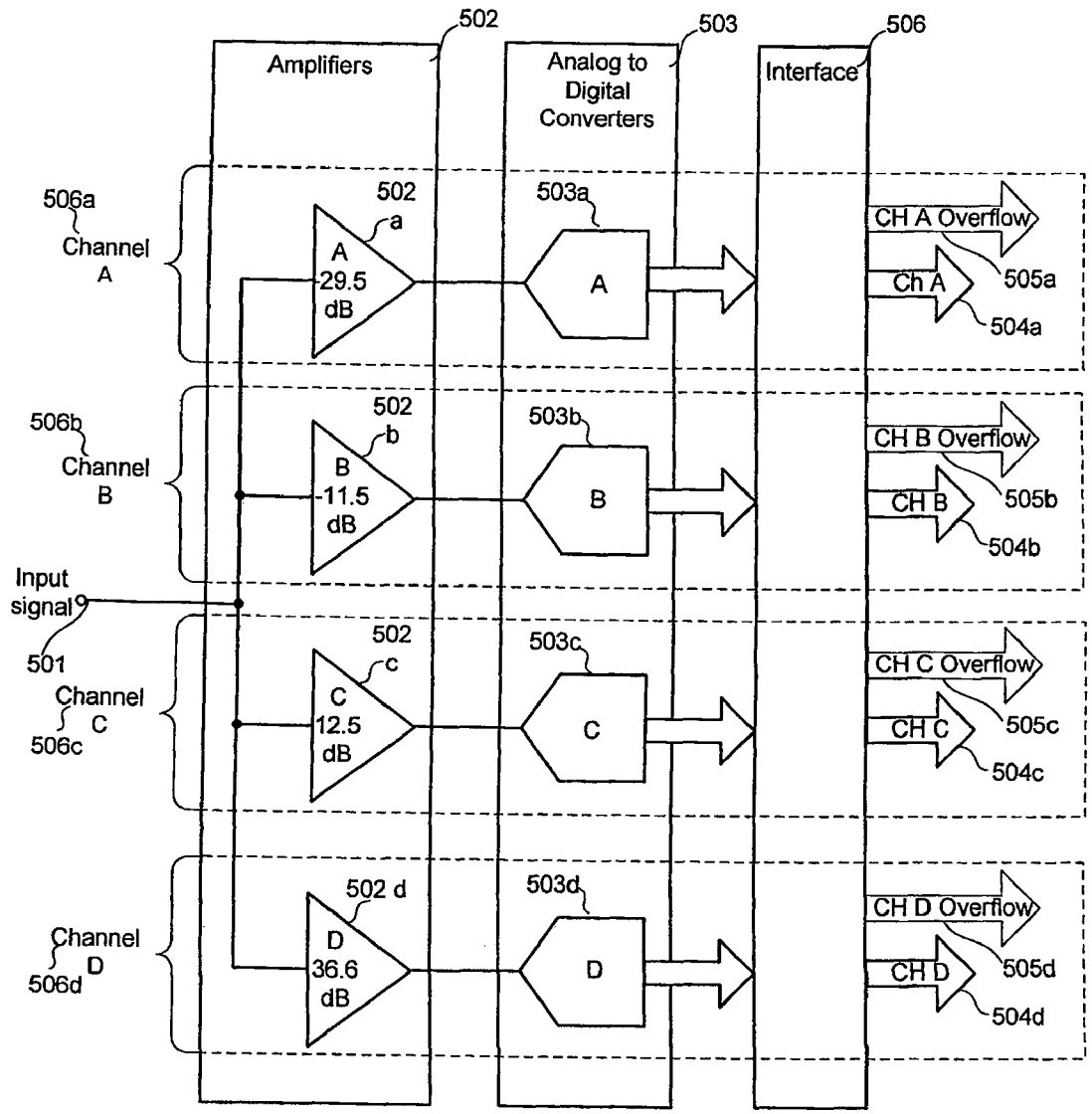
FIG. 5 shows the block diagram of the high dynamic range digitization system.

Blended Signal point 802=[(Ch B output 504b/16)−Ch C output 504c]*CH B−C Blend Factor 109bc+ Ch C output 504c     Formula 1a Note that the divisor 16 above is provided by block 201 of FIG. 2.

f) With reference to Table 1 and FIG. 5, the formula for CH B-C Blend Factor 109bc (column 8) used to determine each Blended point (column 7) is:

IF Ch C Overflow 505c of FIG. 5 indicates that an overflow condition exists, then CH B-C Blend Factor 109bc=1,     Formula 1b else, CH B-C Blend Factor 109bc=Ch C Clipped 104c× 2−1

Where the absolute value of Ch C output 504c is used to determine the value of Ch C Clipped 104c, and Ch C Clipped 104c=0.5 for all Ch C 504c output values <0.5, and Ch C Clipped 104c=Ch C 504c for all Ch C 504c output values >0.5.

It should be noted that the full scale output range of Ch C 504c is +/−1, and that all output values are converted to their absolute value before clipping is performed. The absolute values within the lower 6 dB range of Ch C 504c are clipped to 0.5 because 0.5 is the 6 dB point of the full scale range.

Referring further to Table 1, FIG. 8, and items d, e and f above, blended signal points 802 (depicted with an unfilled triangle Δ) split the error between Ch B signal 705 and Ch C signal 702 in the proportion dictated by CH B-C Blend Factor 109bc of Table 1 (column 8).

because 100% of the weight is placed on channel B when CH B-C Blend Factor 109bc equals 1. Subsequent blended signal points on 802 shift gradually closer to the Ch C 504c value of signal 702, with last blend point 802b being substantially equivalent to Ch C signal point 702b at −48 dB. In this case, channel B has the least weight and channel C has the most weight in determining blend point 802b. The reason for this is that it is desirable to have a gradual change from Ch B signal 705 to Ch C signal 702, for an optimal waveform appearance and fidelity with respect to input signal 501.

Design Implementation Details of the Preferred Embodiment

The following explains how the preferred embodiment is implemented with digital logic circuits.

As mentioned earlier, the channel pairs that may be blended are channels A-B, B-C, and C-D. FIG. 1 is the Blend Factor Calculator which calculates the blend factor between two adjacent channels. The blend factor determines how much weight to place on the respective sample points of the two channels to be blended. The blend factor for each channel pair is determined by the status of the higher resolution analog to digital converter's overflow condition and output sample value of the adjacent lower resolution analog to digital converter.

Although not mentioned previously, it should be noted that the digitization system of the present disclosure provides a means to represent bipolar sampled signals by setting the zero amplitude point at the substantial mid-point of each analog to digital converter's full scale range. Circuits 100, 101 and 102 convert the data from channels D, C and B (504d, 504c and 504b, respectively) to an absolute value prior to being provided to clip blocks 103, 104 and 105, respectively.

Circuits 103, 104 and 105 will clip the absolute data provided by Channels D, C and B to half scale (0.5) if the data is equal to, or below, half scale. If the data is greater than half scale, the data will be passed through without change.

TABLE 1

Preferred embodiment

| (1) dB | (2) Vin max = 30 V 501 | (3) Ch B out 504b | (4) Ch B Clipped 105b | (5) Ch C out 504c | (6) Ch C Clipped 104c | (7) Blended point 802 | (8) CH B-C Blend Factor 109bc | (9) Blend Error w.r.t. Ch C 801 |
|---|---|---|---|---|---|---|---|---|
| −40 | 0.2985 | 0.1472 | 0.5 | 0.0073 | Overflow | 0.0092 | 1 | |
| −40.5 | 0.2818 | 0.1472 | 0.5 | 0.0073 | Overflow | 0.0092 | 1 | |
| −41 | 0.2660 | 0.1328 | 0.5 | 0.0073 | Overflow | 0.0083 | 1 | |
| −41.5 | 0.2512 | 0.1328 | 0.5 | 0.0073 | Overflow | 0.0083 | 1 | |
| −42 | 0.2371 | 0.1168 | 0.5 | 0.0063 | 1.0000 | 0.0073 | 1.0000 | 0.0010 |
| −42.5 | 0.2238 | 0.1168 | 0.5 | 0.0060 | 0.9441 | 0.0072 | 0.8881 | 0.0012 |
| −43 | 0.2113 | 0.1024 | 0.5 | 0.0056 | 0.8913 | 0.0062 | 0.7825 | 0.0006 |
| −43.5 | 0.1995 | 0.1024 | 0.5 | 0.0053 | 0.8414 | 0.0061 | 0.6828 | 0.0008 |
| −44 | 0.1883 | 0.0880 | 0.5 | 0.0050 | 0.7943 | 0.0053 | 0.5887 | 0.0003 |
| −44.5 | 0.1778 | 0.0880 | 0.5 | 0.0047 | 0.7499 | 0.0051 | 0.4998 | 0.0004 |
| −45 | 0.1679 | 0.0880 | 0.5 | 0.0045 | 0.7079 | 0.0049 | 0.4159 | 0.0004 |
| −45.5 | 0.1585 | 0.0736 | 0.5 | 0.0042 | 0.6683 | 0.0043 | 0.3367 | 0.0001 |
| −46 | 0.1496 | 0.0736 | 0.5 | 0.0039 | 0.6310 | 0.0041 | 0.2619 | 0.0002 |
| −46.5 | 0.1412 | 0.0736 | 0.5 | 0.0037 | 0.5957 | 0.0039 | 0.1913 | 0.0002 |
| −47 | 0.1333 | 0.0592 | 0.5 | 0.0035 | 0.5623 | 0.0035 | 0.1247 | 0.0000 |
| −47.5 | 0.1259 | 0.0592 | 0.5 | 0.0033 | 0.5309 | 0.0033 | 0.0618 | 0.0000 |
| −48 | 0.1188 | 0.0592 | 0.5 | 0.0031 | 0.5012 | 0.0031 | 0.0024 | 0.0000 |
| −48.5 | 0.1122 | 0.0592 | 0.5 | 0.0030 | 0.5 | 0.0030 | 0 | |
| −49 | 0.1059 | 0.0448 | 0.5 | 0.0028 | 0.5 | 0.0028 | 0 | |
| −49.5 | 0.1000 | 0.0448 | 0.5 | 0.0026 | 0.5 | 0.0026 | 0 | |
| −50 | 0.0944 | 0.0448 | 0.5 | 0.0025 | 0.5 | 0.0025 | 0 | |

In accordance with Formulas 1a and 1b above, blending starts at point 802a at −42 dB, which is equivalent to Ch B signal point 705b at −42 dB (depicted with a filled diamond ♦)

Circuits 106, 107 and 108 determine the final blend factor value for adjacent channels C-D, B-C and A-B (109cd, 109bc and 109ab, respectively). Referring to Formulas 1a and 1b described earlier, if analog to digital converter overflow is indicated for the higher resolution channel of the channel pair to be blended, the blending factor will be equal to 1 and this channel will not be used for the final assembled output. The output from the lower resolution channel will be used instead. If overflow condition is not present, then the formulas below, and shown in blocks 106, 107 and 108, will determine the blending factor for adjacent channels C-D, B-C and A-B.

Blending Factor Formulas $$\text{Blending Factor } C\text{-}D = (((CH\ D\ \text{CLIP})*2)-1)$$

$$\text{Blending Factor } B\text{-}C = (((CH\ C\ \text{CLIP})*2)-1)$$

$$\text{Blending Factor } A\text{-}B = (((CH\ B\ \text{CLIP})*2)-1)$$

Referring to FIG. 2, circuits 200, 201 and 202 provide the input of subtractors 203, 204 and 205 bit shifted values of channel C, B and A shifted to match the gain of channel D to C, channel C to B and channel B to A, respectively. Matching the gain will set the amplitude level substantially equal for subtraction.

Circuit 203, 204 and 205 are subtractors that subtract the two adjacent channels to determine the difference in amplitude between them—i.e. C minus D, B minus C and A minus B. The adjacent channel differences will be multiplied by the corresponding blend factor and added to the specific channel for blending as shown in FIG. 3.

Figure 3:
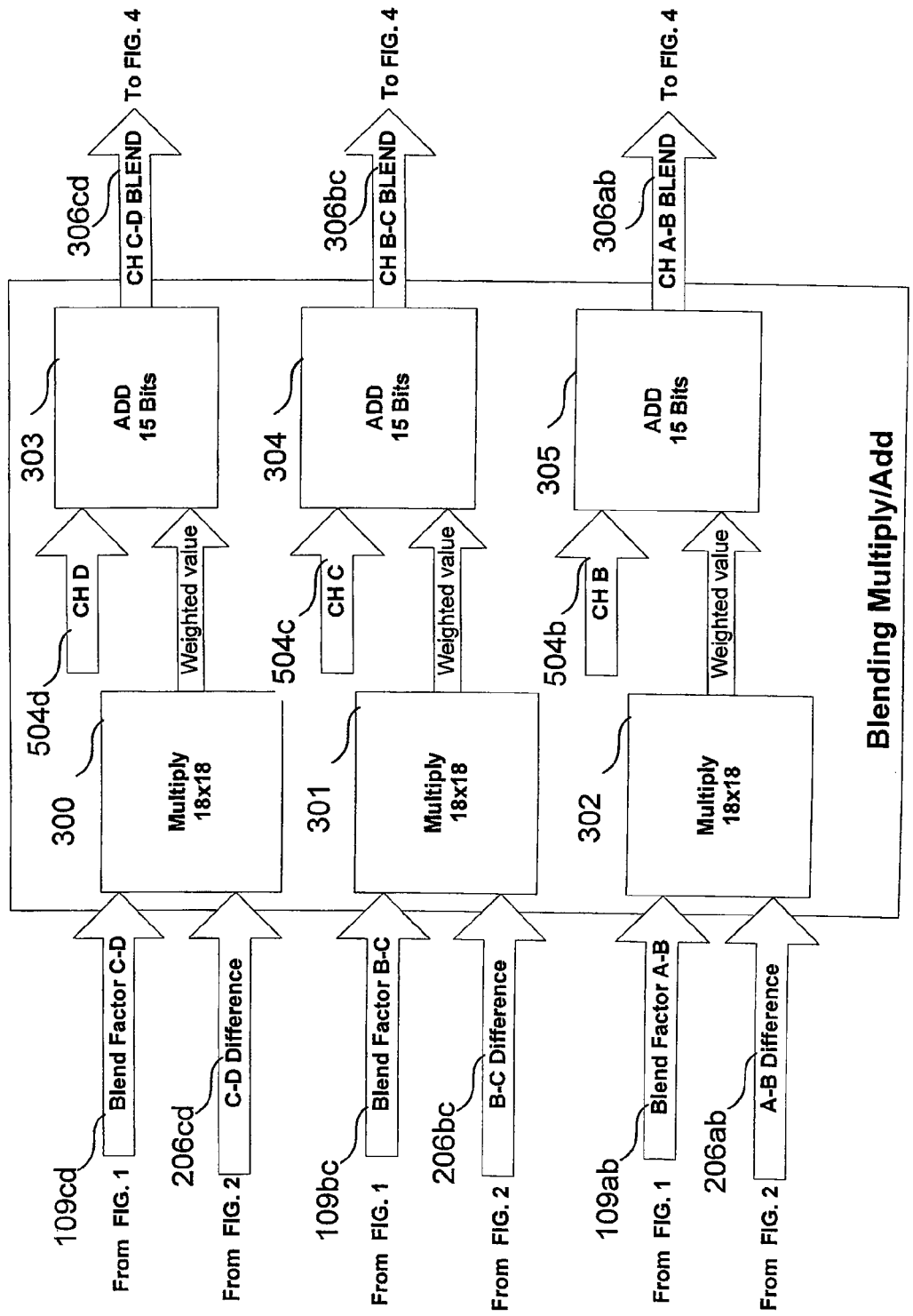
FIG. 3 shows the Blending Multiply/Add stage to blend the raw channel with adjacent channel difference.

FIG. 3 is the Blending Multiplier/Add block which is the final stage for blending channels C to D, B to C and A to B. The 18×18 bit multipliers shown as block 300, 301 and 302 will multiply the difference in adjacent blend channels (206cd, 206bc and 206ab) by blend factor 109cd, 109bc and 109ab, respectively, to determine the weighted sample values provided to 15 bit add blocks 303, 304 and 305.

Figure 4:
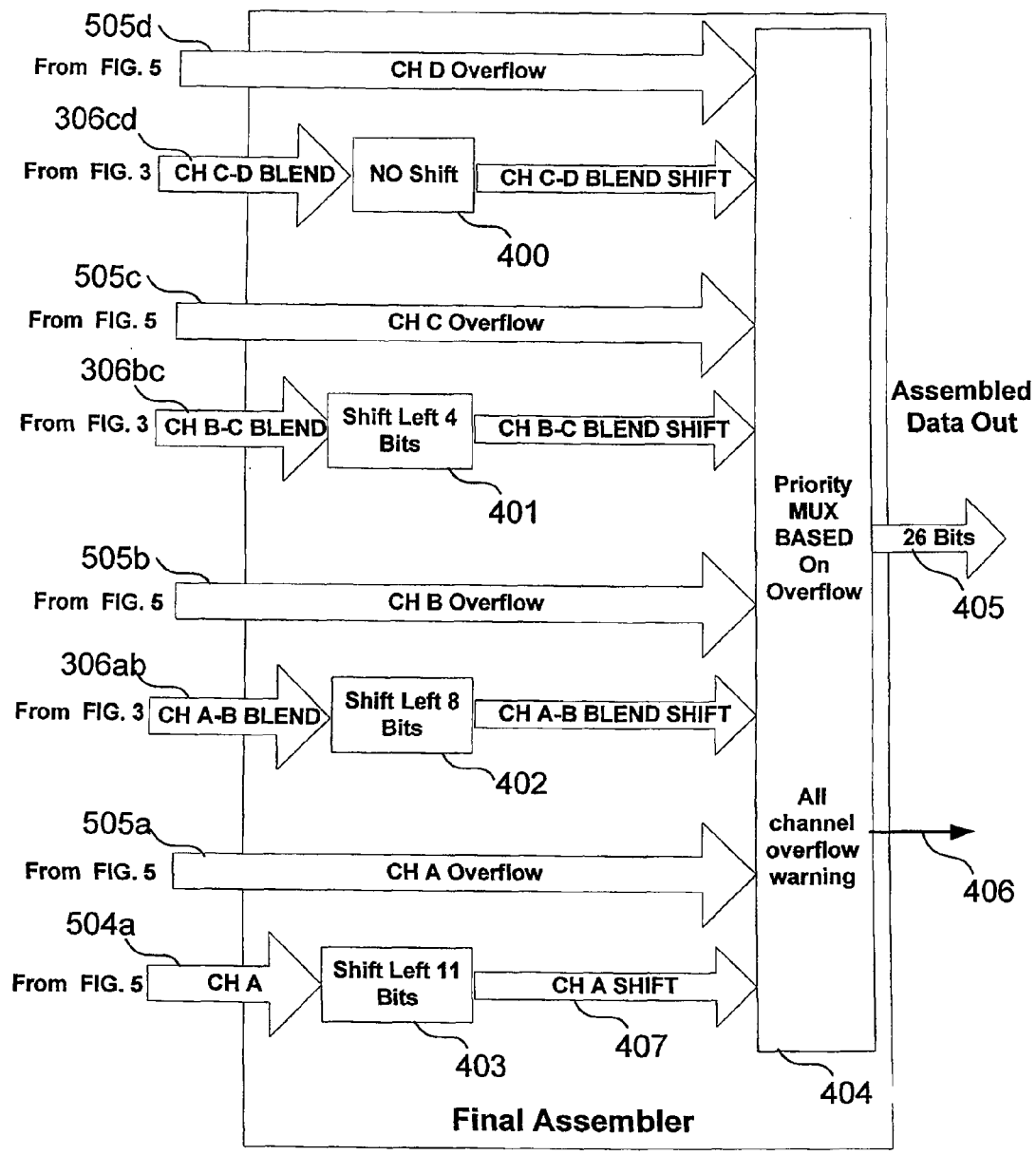
FIG. 4 shows the Final Assembler stage to assemble the output data from the 4 channels blended.

FIG. 4 is the final assembler stage used to assemble the four 15 bit channels D, C, B and A into a 26 bit data format by shifting the data based on the analog gain of each channel.

Circuits 400, 401, 402, and 403 will shift the data channels based on the analog gain associated with each channel to bring each blended channel C-D, B-C, A-B, and A to the same gain point (i.e. blended channels 306cd, 306bc, 306ab and 504a, respectively).

Circuit 404 is a priority multiplexor where Channel D has highest resolution and priority while Channel A has the least. The overflow indication is first examined for the highest priority channel and if it is overflowed then the next highest priority channel will be examined for overflow. This process will be done until the channel without overflow is found and that channel will be sent through to the 26 Bit data output circuit 405. If all channels are in an overflow condition, an all channel overflow warning is indicated by means of 1 bit signal 406, CH A Shift 407 will be provided to output 405.

Below is the formula describing how the priority multiplexor works and how the output data is selected.

Assemble Data Formula
If (CH D Not Overflowed)
    Assembled Data Out=CH C-D BLEND SHIFT
ELSE IF (CH C Not Overflowed)
    Assembled Data Out=CH B-C BLEND SHIFT
ELSE IF (CH B Not Overflowed)
    Assembled Data Out=CH A-B BLEND SHIFT
ELSE IF (CH A Not Overflowed)
    Assembled Data Out=CH A SHIFT
ELSE
    Assembled Data Out=CH A Shift 407, and the All Channel Overflow Warning is indicated Alternate Embodiment 1

As previously mentioned, it is beneficial to progressively reduce Blend Error 801 (FIG. 8) between Ch B and Ch C for each successive sample point within blend range 803 in order to provide the smoothest transition between channels, and thereby produce a more optimal waveform appearance and fidelity with respect to input signal 501.

Although the preferred embodiment is simpler to implement, it does not provide this benefit because of the quantization errors of Ch B signal 705, as can be seen at points 801 a, b, and c, and some of the points that follow.

Alternate embodiment 1 further improves error magnitude minimization by checking during each 10 ns sample period whether the output sample value 504b of analog to digital converter 503b has changed compared to the previous sample, and if it has not uses Formula 2 below instead of Formula 1a described earlier. If successive samples have changed, Formula 1a is used. Table 1a below contains the exemplary values associated with FIG. 9.

Current Blended Signal point 802=Previous Blend Error 801×Current CH B-C Blend Factor 109bc+ Ch C output 504c    Formula 2

A step by step description of alternate embodiment 1 is as follows:

STEP 1. Analog to digital converters 503b and 503c sample the output of amplifiers 502b and 502c, respectively, at substantially the same time.

STEP 2. Analog to digital converters 503b and 503c provide sample points for signals 705 and 702 at substantially the same time.

STEP 3. Sample point 503b from Ch B is compared to previously stored sample point for 503b.

STEP 4. If sample points of step 3 are equal, apply Formula 2, if not, apply Formula 1a.

Figure 9:
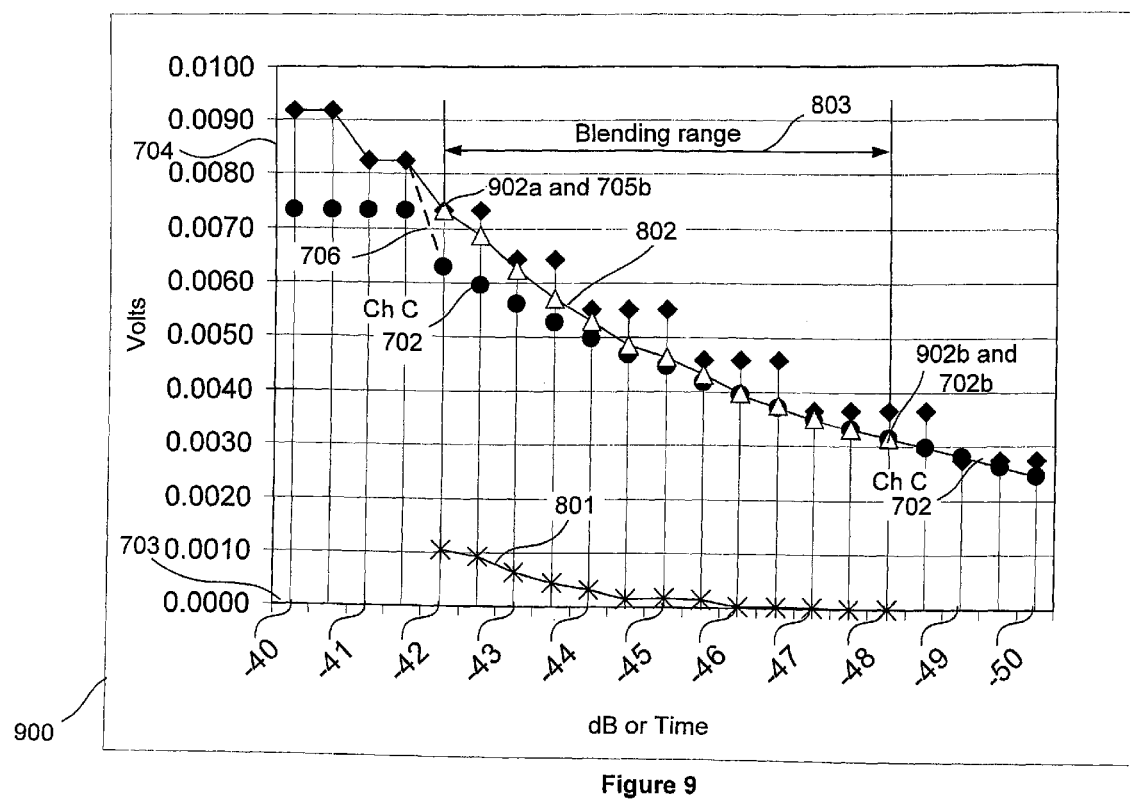
FIG. 9 shows the −40 to −50 dB range of the digitized output signals of channel B and C with errors. The blended and error signal are also shown.

Referring to FIG. 9 and associated values in Table 1a below, it can be seen that blended signal 902 is monotonic and lower in aggregate error magnitude, thereby conforming more closely to Ch C signal 702 than non-monotonic blended signal 802. Blend error signals 901 and 801 are indicative of this as well.

TABLE 1a

| | | | | | | | | |
|---|---|---|---|---|---|---|---|---|
| | | | | Alternate embodiment 1 | | | | |
| (1) dB | (2) Vin max = 30 V 501 | (3) Ch B out 504b | (4) Ch B Clipped 105b | (5) Ch C out 504c | (6) Ch C Clipped 104c | (7) Blended point 802 | (8) CH B-C Blend Factor 109bc | (9) Blend Error w.r.t. Ch C 801 |
| −40 | 0.2985 | 0.1472 | 0.5 | 0.0073 | Overflow | 0.0092 | 1 | |
| −40.5 | 0.2818 | 0.1472 | 0.5 | 0.0073 | Overflow | 0.0092 | 1 | |
| −41 | 0.2660 | 0.1328 | 0.5 | 0.0073 | Overflow | 0.0083 | 1 | |
| −41.5 | 0.2512 | 0.1328 | 0.5 | 0.0073 | Overflow | 0.0083 | 1 | |
| −42 | 0.2371 | 0.1168 | 0.5 | 0.0063 | 1.0000 | 0.0073 | 1.0000 | 0.0010 |

TABLE 1a-continued

Alternate embodiment 1

| (1) dB | (2) Vin max = 30 V 501 | (3) Ch B out 504b | (4) Ch B Clipped 105b | (5) Ch C out 504c | (6) Ch C Clipped 104c | (7) Blended point 802 | (8) CH B-C Blend Factor 109bc | (9) Blend Error w.r.t. Ch C 801 |
|---|---|---|---|---|---|---|---|---|
| −42.5 | 0.2238 | 0.1168 | 0.5 | 0.0060 | 0.9441 | 0.0069 | 0.8881 | 0.0009 |
| −43 | 0.2113 | 0.1024 | 0.5 | 0.0056 | 0.8913 | 0.0062 | 0.7825 | 0.0006 |
| −43.5 | 0.1995 | 0.1024 | 0.5 | 0.0053 | 0.8414 | 0.0057 | 0.6828 | 0.0004 |
| −44 | 0.1883 | 0.0880 | 0.5 | 0.0050 | 0.7943 | 0.0053 | 0.5887 | 0.0003 |
| −44.5 | 0.1778 | 0.0880 | 0.5 | 0.0047 | 0.7499 | 0.0048 | 0.4998 | 0.0002 |
| −45 | 0.1679 | 0.0880 | 0.5 | 0.0045 | 0.7079 | 0.0046 | 0.4159 | 0.0002 |
| −45.5 | 0.1585 | 0.0736 | 0.5 | 0.0042 | 0.6683 | 0.0043 | 0.3367 | 0.0001 |
| −46 | 0.1496 | 0.0736 | 0.5 | 0.0039 | 0.6310 | 0.0040 | 0.2619 | 0.0000 |
| −46.5 | 0.1412 | 0.0736 | 0.5 | 0.0037 | 0.5957 | 0.0038 | 0.1913 | 0.0000 |
| −47 | 0.1333 | 0.0592 | 0.5 | 0.0035 | 0.5623 | 0.0035 | 0.1247 | 0.0000 |
| −47.5 | 0.1259 | 0.0592 | 0.5 | 0.0033 | 0.5309 | 0.0033 | 0.0618 | 0.0000 |
| −48 | 0.1188 | 0.0592 | 0.5 | 0.0031 | 0.5012 | 0.0031 | 0.0024 | 0.0000 |
| −48.5 | 0.1122 | 0.0592 | 0.5 | 0.0030 | 0.5 | 0.0030 | 0 | |
| −49 | 0.1059 | 0.0448 | 0.5 | 0.0028 | 0.5 | 0.0028 | 0 | |
| −49.5 | 0.1000 | 0.0448 | 0.5 | 0.0026 | 0.5 | 0.0026 | 0 | |
| −50 | 0.0944 | 0.0448 | 0.5 | 0.0025 | 0.5 | 0.0025 | 0 | |

Alternate Embodiment 2

In the event noise is masking the quantization error, thereby preventing alternate embodiment 1 from working, Formula 2 can be modified to make Formula 3 below.

Current Blended Signal point 802=Average of N previous Blend Errors 801×Current CH B-C Blend Factor 109bc+Ch C output 504c      Formula 3

Where N is a number of previous contiguous Blend Errors 801.

Alternate Embodiment 3

The sample point amplitude adjustment method of the preceding embodiments may be further improved by a method of sample time adjustment.

Referring to FIG. 8, the sample points located in blending range 803 for signals 705 (Ch B) and 702 (Ch C) are compared to determine the time skew error between them. This error is then used to determine the time compensation required to substantially eliminate the skew delays between adjacent channels, and thereby minimize the sample errors.

It should be noted that the preferred embodiments as disclosed above use multiple physical channels, each using a respective analog to digital converter (ADC), so that each channel outputs a streaming digital output associated with a respective physical ADC. These streaming digital outputs are then processed by the blending circuit to produce the composite digital output. However, the present disclosure includes the concept and implementation where a single or several analog to digital converters is/are "time-multiplexed", so that one or more of the ADC's provides multiple ones of the streaming digital outputs processed by the blending circuit. Indeed, the adders, multipliers and other components of the blending circuit may also be used in a "time-multiplexed" manner to realize even greater reduction in the amount of circuit hardware needed to produce the ultimate composite digital output. Similarly, streaming digital outputs produced by any digital method can also be processed using the presently disclosed blending technology and methodology as described above.

Although the present invention has been described in relation to particular embodiments thereof, many other variations and modifications and other uses will become apparent to those skilled in the art. It is preferred, therefore, that the present invention not be limited by the specific disclosure herein, but instead be construed solely with reference to the appended claims.

What is claimed is:

1. A high dynamic range analog to digital conversion system, comprising:
   an input circuit for receiving an analog input signal;
   a signal processing circuit coupled with the input circuit for receiving and processing the analog input signal, the signal processing circuit including at least two signal processing channels, each channel being configured to scale the input signal to a different degree, and to output a respective digital output and a respective overflow indication; and
   a blending circuit, coupled to the digital outputs of the channels and to their respective overflow indications and configured to produce therefrom a composite digital signal which combines the digital outputs in a manner which blends and/or adjusts at least a portion of each digital output being used to minimize phase and/or amplitude discontinuity of the composite digital signal.

2. The digital conversion system of claim 1, wherein the blending circuit includes:
   a blend factor calculator configured to calculate a respective blend factor for adjacent ones of the processing channels, responsive to the overflow indications and the digital outputs of the analog to digital converters;
   a blending subtractor for producing difference signals corresponding to the adjacent channels; and
   a blending multiplier and adding circuit responsive to the difference signals and to the blend factors to produce respective scaled blended signals for the adjacent channels.

3. The digital conversion system of claim 2, in which the blending circuit further includes a blending assembler circuit responsive to said overflow indications and to said scaled blended signals to produce said composite digital signal.

4. The digital conversion system of claim 2, in which the number of the scaled blended signals equals to the number of channels, less one.

5. The digital conversion system of claim 2, in which the blend factor calculator includes an absolute value circuit configured to convert certain ones of the digital outputs and to produce absolute values thereof.

6. The digital conversion system of claim 5, wherein the blend factor calculator also includes a clipping circuit.

7. The digital conversion system of claim 6, in which the blend factor calculator is configured to render the blend factors as either the numeric 1, if the respective channel overflow indication indicates an overflow, or else to produce the blend factor as a clipped signal of the digital output, multiplied by two, less one.

8. The digital conversion system of claim 1, in which the analog input signal is amplified at the inputs to each channel by a respective scale factor, wherein the scale factors span at least about 80 dB, from a negative dB scale value to a positive dB scale value.

9. The digital conversion system of claim 2, wherein the blending subtractor includes signal level shifters.

10. The digital conversion system of claim 2, in which the blending multiplier and adding circuit includes multipliers for multiplying the difference signals by the blend factors to produce weighted signals and adders configured to add the weighted signals with the signals to produce the scaled blended signals.

11. The digital conversion system of claim 1, including at least four digital to analog channels, with each channel producing its digital output with a predetermined number of bits and wherein the composite digital signal is produced with a number of bits approximately double the predetermined number.

12. The digital conversion system of claim 1, in which the composite digital signal is produced to utilize a full scale range signal referenced to the magnitude of the analog input signal.

13. The digital conversion system of claim 2, in which adjacent channels are blended over a 6 d3B blend range thereof.

14. The digital conversion system of claim 2, wherein the blend factor for each pair of adjacent channels is determined by the status of the higher resolution analog to digital converter's overflow indication and the digital output of the adjacent lower resolution analog to digital converter.

15. The digital conversion system of claim 2, wherein the input signal is a bipolar analog input signal which has its zero amplitude point set as a substantial mid-point of each analog to digital converter's full scale range.

16. The digital conversion system of claim 2, wherein blend factors are additionally calculated based on references to prior values of the digital output, in order to progressively reduce blend errors between channels.

17. The digital conversion system of claim 2, in which a current blended signal point is calculated as an average of N previous blend errors, multiplied by a current blend factor, to which there is added the digital output of one of the channels, wherein N is a number of previous contiguous blend errors, in a manner effective to mask noise quantization errors.

18. The digital conversion system of claim 2, including a facility configured to determine time skew errors between signal sample points and to determine time compensations required to substantially eliminate skew delays between adjacent channels.

19. The digital conversion system of claim 1, in which each signal processing channel comprises its own respective digital to analog converter.

20. The digital conversion system of claim 1, including at least three signal processing channels.

* * * * *